(12) United States Patent
Rana et al.

(10) Patent No.: US 11,070,128 B2
(45) Date of Patent: Jul. 20, 2021

(54) CHARGE PUMP REGULATION CIRCUIT TO INCREASE PROGRAM AND ERASE EFFICIENCY IN NONVOLATILE MEMORY

(71) Applicant: STMicroelectronics International N.V., Schiphol (NL)

(72) Inventors: Vikas Rana, Noida (IN); Shivam Kalla, Bikaner (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/715,209

(22) Filed: Dec. 16, 2019

(65) Prior Publication Data

US 2020/0235659 A1    Jul. 23, 2020

Related U.S. Application Data

(60) Provisional application No. 62/795,853, filed on Jan. 23, 2019.

(51) Int. Cl.
*H02M 3/07* (2006.01)
*G11C 16/30* (2006.01)
*G11C 5/14* (2006.01)

(52) U.S. Cl.
CPC ............ *H02M 3/07* (2013.01); *G11C 5/147* (2013.01); *G11C 16/30* (2013.01)

(58) Field of Classification Search
CPC ........... G11C 5/147; G11C 16/30; H02M 3/07
See application file for complete search history.

(56) References Cited

U.S. PATENT DOCUMENTS 5,553,295 A    9/1996   Pantelakis et al.
5,692,164 A    11/1997  Pantelakis
(Continued)

FOREIGN PATENT DOCUMENTS

CN    1627448 A       6/2005
CN    101894586 A    11/2010
(Continued)

OTHER PUBLICATIONS

Soldera J., et al: "A Low Ripple Fully Integrated Charge Pump Regulator," Proceedings of the 16th Symposium on Integrated Circuits and Systems Design, (SBCCI'03)), 2003 IEEE, (Year: 2003).*

(Continued)

*Primary Examiner* — Patrick C Chen
(74) *Attorney, Agent, or Firm* — Crowe & Dunlevy

(57) ABSTRACT

A charge pump circuit generates a charge pump output signal at a first node and is enabled by a charge pump control signal. A diode has first and second terminals coupled to first and second nodes. A comparator has an inverting input coupled to the second node and a non-inverting input coupled to a third node, and causes generation of the charge pump control signal. A first current mirror produces a first current at the second node, and a second current mirror produces a second current (equal in magnitude to the first current) at the third node. The first terminal and second terminals may be a cathode and an anode. The first current mirror may be a current sink sinking a first current from the second node. The second current mirror may be current source sourcing a second current (equal in magnitude to the first current) to the third node.

47 Claims, 7 Drawing Sheets

(56) References Cited

U.S. PATENT DOCUMENTS

| | | | |
|---|---|---|---|
| 5,721,704 | A | 2/1998 | Morton |
| 5,986,947 | A | 11/1999 | Choi et al. |
| 6,418,040 | B1 | 7/2002 | Meng |
| 6,445,243 | B2 | 9/2002 | Myono |
| 7,145,370 | B2 | 12/2006 | Bernard et al. |
| 7,342,438 | B2 | 3/2008 | Muneer et al. |
| 7,427,890 | B2 * | 9/2008 | Chan .................. H02M 3/07 327/536 |
| 7,741,898 | B2 | 6/2010 | Hsu |
| 8,179,734 | B2 * | 5/2012 | Soma .................. G11C 16/30 365/201 |
| 8,693,256 | B2 | 4/2014 | Pasotti et al. |
| 9,159,425 | B2 | 10/2015 | Rana et al. |
| 9,627,441 | B2 | 4/2017 | Van Buskirk |
| 2008/0157729 | A1 | 7/2008 | Chan |
| 2011/0002164 | A1 | 1/2011 | Soma |
| 2013/0010536 | A1 | 1/2013 | Wang et al. |
| 2017/0063369 | A1 | 3/2017 | Boakye et al. |
| 2019/0213234 | A1 * | 7/2019 | Bayat .................. G11C 11/54 |

FOREIGN PATENT DOCUMENTS

| | | |
|---|---|---|
| CN | 102354521 A | 2/2012 |
| CN | 107924205 A | 4/2018 |

OTHER PUBLICATIONS

Soldera, J., et al: "A Low Ripple Fully Integrated Charge Pump Regulator," Proceedings of the 16th Symposium on Integrated Circuits and Systems Design, (SBCCI'03), 2003 IEEE (4 pages).

Calligaro, Cristiano, et al: "Voltage Multiplier With Output Stabilization," 1996 IEEE (pp. 905-908).

Kim, Sung-Eun, et al: "A Small Ripple Regulated Charge Pump With Automatic Pumping Control Schemes," 2004 IEEE (pp. 383-386).

Shor, Joseph S., et al: "Self-Regulated Four-Phased Charge Pump with Boosted Wells," 2003 IEEE (pp. 1-241 thru 1-244).

First Office Action and Search Report for co-pending CN Appl. No. 202010066352.2 dated Jun. 4, 2021 (6 pages) no English translation considered as is.

* cited by examiner

CHARGE PUMP REGULATION CIRCUIT TO INCREASE PROGRAM AND ERASE EFFICIENCY IN NONVOLATILE MEMORY

RELATED APPLICATION

This application claims priority to U.S. Provisional Application for Patent No. 62/795,853, filed Jan. 23, 2019, the contents of which are incorporated by reference in their entirety.

TECHNICAL FIELD

This disclosure is related to a charge pump and associated regulation circuitry for generating program and erase voltages for use in a non-volatile memory.

BACKGROUND

Non-volatile memory devices are used in applications where it is desirable to store information that is to be retained even when the device into which the non-volatile memory is incorporated is not powered. Generally, each non-volatile memory device includes a matrix of memory cells utilizing floating gate MOS storage transistors; each such floating gate MOS storage transistor has a threshold voltage that may be set (according to an electric charge in its floating gate) to different levels to represent different logic values.

For example, in Electrically Erasable and Programmable Read-Only Memories (EEPROMs) each floating gate MOS storage transistor may be both programmed (by injecting electric charge into its floating gate) or erased (by removing electric charge from its floating gate) individually thanks to the use of a set of MOS selection transistors that selectively apply the required voltages to the corresponding storage floating gate MOS transistor (with a complex structure that limits the capacity of the EEPROMs). On the other hand, flash memories have a simple structure that allows obtainment of very high capacities of hundreds of Gigabytes or even higher thanks to the grouping of the floating gate MOS transistors in sectors, each integrated in a common well of semiconductor material without a selection transistor, but with a structure that enables the erasing at a sector level instead of at an individual level.

In both cases, as well as in the case of any non-volatile memory, program and erase efficiency is a function of the electric field applied across the floating gate MOS storage transistors. To generate these electric fields, a high voltage is generated by a charge pump and applied to a word line (for program operations) or applied to a substrate line (for erase operations). Floating gate MOS storage transistors have parasitic diodes formed by the PN junction between their source and drain. During both the program and erase operations, these parasitic diodes are reverse biased.

Some non-volatile memory cells may be made using a triple well technology where an isolated Pwell structure is used to make an NMOS device. There are two extra parasitic diodes present in triple well technology: one PN junction (and thus parasitic diode) is between the isolated Pwell and the Nwell and another PN junction (and thus parasitic diode) is between the Nwell and the substrate. In any design, these junctions should be reverse biased so that proper functionality can be maintained during at least program and erase operations.

Due to process and temperature variations, some parasitic diodes of a non-volatile memory cell can be being electrically stressed, which could lead to breakdown, and improper function (or even damage) of the non-volatile memory cell.

In order to avoid such condition, it is possible to define rail voltages for these parasitic PN junctions in triple well technology. Normally the PN junction between an isolated Pwell and an Nwell is named as "Intrail" and the PN junction between the Nwell and the substrate is named as "extrail". Rail voltage limits can be defined for these PN junctions, which serve to change the design rule for the PN junctions and eventually changes the break-down voltage as well. For example, if a designer knows that maximum voltage across the PN junctions is going to be 15V, then a rail voltage of more than 15V will be defined to avoid break-down of these PN junctions. However, this leads to an increased area cost and potentially an increased production cost.

Therefore, to avoid the defining of over-estimated rail voltages and the associated area and production cost, a new regulation scheme for the charge pump circuits has been developed. An example charge pump and regulation circuit 50 is shown in FIG. 1. The charge pump and regulation circuit 50 includes a charge pump 52 that generates a charge pump output voltage OUT under control of the clock signals CLK and CLKN, which are logical inverts of each other. A resistive divider formed from resistors R1 and R2 is coupled in series between the output of the charge pump 52 and ground. Node N denotes the partitioning of the resistive divider. A comparator 54 has its non-inverting input coupled to receive a bandgap voltage VBG (or any reference voltage which is stable across different processes, temperature, and supply conditions), its inverting input coupled to the partitioning of the resistive divider at node N, and generates a control signal OSTOP at its output, and OSTOP can be either an oscillator or a clock control signal. The oscillator control signal OSTOP is an on/off enable signal and controls an oscillator 60 that generates the clock signals CLK and CLKN that in turn control the charge pump 52. When OSTOP is at a logic high, the oscillator 60 is enabled, and when OSTOP is at a logic low, the oscillator 60 is disabled.

In operation, the voltage ladder serves to detect the output voltage OUT of the charge pump 52 at node N. The voltage at node N is then compared to the bandgap voltage VBG. If the voltage at node N is below the bandgap voltage VBG, the comparator 54 generates the oscillator control signal OSTOP at a logic high. When the oscillator control signal OSTOP is at a logic high, the oscillator 60 generates or outputs the clock signals CLK and CLKN to cause the charge pump 52 to ramp up the voltage of the charge pump output signal OUT. The voltage of the charge pump output signal OUT therefore continues to ramp up until the voltage at node N is equal to the bandgap voltage VBG, at which point the comparator 54 generates the oscillator control signal OSTOP at a logic low. As a result, the oscillator 60 deactivates or stops generation of the clock signals CLK and CLKN so as to stop ramp up of the charge pump 52.

This regulation scheme is effective, but must be set to account for the worst case operating scenario of the non-volatile memory so that the voltage of the output signal OUT does not result in breakdown of a parasitic diode, such as one within the triple well of a non-volatile memory. This requirement to account for the worst case operating scenario arises out of the fact that the regulation scheme does not track variations over process or temperature.

Therefore, further development is needed.

SUMMARY

Disclosed herein is a circuit including a charge pump circuit configured to generate a charge pump output signal at a first node, with the charge pump circuit being enabled as a function of at least one charge pump control signal. A diode has a cathode coupled to the first node and an anode coupled to a second node. A comparator has an inverting input coupled to the second node and a non-inverting input coupled to a third node, the comparator being configured to cause generation of the at least one charge pump control signal. A current sink is configured to sink a first current from the second node, and a current source is configured to source a second current to the third node, the second current having a same magnitude as the first current.

The comparator may generate an oscillator control signal, and an oscillator may be configured to generate the at least one charge pump control signal as a function of the oscillator control signal generated by the comparator.

The circuit may also include a non-volatile memory, and the diode may be formed using a same process as transistors of the non-volatile memory.

The circuit may include a semiconductor substrate, a non-volatile memory may be formed in the semiconductor substrate, and the diode may also be formed in the semiconductor substrate.

The current sink may include a first n-channel transistor having a drain coupled to the second node, a source coupled to a reference voltage, and a gate. A second n-channel transistor may have a drain coupled to the third node, a source coupled to the reference voltage, and a gate coupled to the gate of the first n-channel transistor and to the drain of the second n-channel transistor.

The current source may include a first p-channel transistor having a source coupled to a supply node, a drain coupled to the third node, and a gate, and a second p-channel transistor having a source coupled to the supply node, a drain coupled to a current source, and a gate coupled to the gate of the first p-channel transistor and to the drain of the second p-channel transistor.

A diode may be coupled to a transistor having a drain coupled to the first node, a source providing an output signal, and a gate coupled to the drain of the diode coupled transistor.

The at least one charge pump control signal may include a clock signal and a complement of the clock signal.

Also disclosed herein is a charge pump circuit generating a charge pump output signal at a first node as a function of at least one charge pump control signal, a diode having a cathode coupled to the first node and an anode coupled to a second node, and a current sink configured to sink a first current from the second node. A current source is configured to source a second current to a third node, with the second current having a same magnitude as the first current. A comparison circuit is configured to compare a voltage at the second node to a voltage at the third node, cause the at least one charge pump control signal to direct the charge pump circuit to generate the charge pump output signal having a voltage that ramps upward in magnitude if the voltage at the second node is less than the voltage at the third node, and cause the at least one charge pump control signal to direct the charge pump circuit to cease upward ramp of the voltage of the charge pump output signal if the voltage at the second node is at least equal to the voltage at the third node.

The circuit may also include a non-volatile memory, and the diode may be formed using a same process as transistors of the non-volatile memory.

The circuit may include a semiconductor substrate. A non-volatile memory may be formed in the semiconductor substrate, and the diode may also be formed in the semiconductor substrate.

The current sink may be a first current mirror having an input coupled to the third node and an output coupled to the second node.

The current source may be a second current mirror having an input coupled to a current source and an output coupled to the third node.

A method aspect is disclosed herein. The method may include generating a charge pump output signal that has a voltage that ramps upward in magnitude, receiving the charge pump output signal at a cathode of a diode, sinking a first current from an anode of the diode, sourcing a second current to a node, the second current being equal in magnitude to the first current, and comparing a voltage at the node to a voltage at the anode of the diode. When the voltage at the anode of the diode becomes equal to the voltage at the node, the charge pump output signal is caused to cease ramping upward in magnitude.

Sourcing the second current to the node may be performed by mirroring a reference current to the node as the second current.

Sinking the first current from the anode of the diode may be performed by mirroring the second current to be drawn from the anode of the diode as the first current.

Another method aspect disclosed herein includes pumping a charge pump to output a voltage, receiving the voltage output by the charge pump at a cathode of a diode, sinking a first current from an anode of the diode, sourcing a second current to a node, the second current being equal in magnitude to the first current, and comparing a voltage at the node to a voltage at the anode of the diode. When the voltage at the anode of the diode becomes equal to the voltage at the node, pumping of the charge pump is stopped.

Sourcing the second current to the node may be performed by mirroring a reference current to the node as the second current.

Sinking the first current from the anode of the diode may be performed by mirroring the second current to be drawn from the anode of the diode as the first current.

Also disclosed herein is a circuit including a charge pump circuit configured to generate a charge pump output signal at a first node, the charge pump circuit being enabled as a function of at least one charge pump control signal. A diode has a first terminal coupled to the first node and a second terminal coupled to a second node. A comparator has an inverting input coupled to the second node and a non-inverting input coupled to a third node, the comparator configured to cause generation of the at least one charge pump control signal. A first current mirror is configured to produce a first current at the second node. A second current mirror is configured to produce a second current at the third node, the second current having a same magnitude at the first current.

Also disclosed herein is a circuit including a charge pump circuit generating a charge pump output signal at a first node as a function of at least one charge pump control signal. A diode has a first terminal coupled to the first node and a second terminal coupled to a second node. A first current mirror is configured to produce a first current at the second node. A second current mirror is configured to produce a second current at a third node, the second current having a same magnitude as the first current. A comparison circuit is configured to compare a voltage at the second node to a voltage at the third node, cause the at least one charge pump control signal to direct the charge pump circuit to generate the charge pump output signal having a voltage that ramps in magnitude, based upon the voltage at the second node being unequal to the voltage at the third node, cause the at least one charge pump control signal to direct the charge pump circuit to cease the ramping of the voltage of the charge pump output signal, if the voltage at the second node is at least equal to the voltage at the third node.

Also disclosed herein is a method including generating a charge pump output signal that has a voltage that ramps, receiving the charge pump output signal at a first terminal of a diode, producing a first current at a second terminal of the diode, producing a second current to a node (the second current being equal in magnitude to the first current), and comparing a voltage at the node to a voltage at the second terminal of the diode. When the voltage at the second terminal of the diode becomes equal to the voltage at the node, the charge pump output signal is caused to cease ramping.

Another method disclosed herein includes pumping a charge pump to output a voltage, receiving the voltage output by the charge pump at a first terminal of a diode, producing a first current at a second terminal of the diode, producing a second current to a node, the second current being equal in magnitude to the first current, comparing a voltage at the node to a voltage at the second terminal of the diode, when the voltage at the second terminal of the diode becomes equal to the voltage at the node, stopping pumping of the charge pump.

Also disclosed herein is a circuit including a charge pump circuit configured to generate a charge pump output signal at a first node, the charge pump circuit being enabled as a function of at least one charge pump control signal. A diode has a first terminal coupled to the first node and a second terminal coupled to a second node. A comparator has an inverting input coupled to the second node and a non-inverting input coupled to a third node, the comparator being configured to compare a voltage at the second node to a voltage at the third node and to output a control signal based upon the comparison. A charge pump control circuit generates the at least one charge pump control signal based upon the control signal from the comparator. A first current mirror produces a first constant current at the second node. A second current mirror produces a second constant current at the third node.

Also disclosed herein is a circuit including a charge pump circuit configured to generate a charge pump output signal at a first node. A diode has a first terminal coupled to the first node and a second terminal coupled to a second node. A comparison circuit has inputs coupled to the first and second nodes, and at least one output coupled to the charge pump. A first current mirror produces a first constant current at the second node. A second current mirror produces a second constant current at the third node. The comparison circuit includes a comparator comparing a voltage at the second node to a voltage at the third node. A charge pump control circuit receives output from the comparator and causes the charge pump circuit to generate the charge pump output signal having a voltage that ramps (if the voltage at the second node is unequal to the voltage at the third node in magnitude), and causes the charge pump circuit to ramping of the voltage of the charge pump output signal, if the voltage at the second node is at least equal to the voltage at the third node.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Throughout this disclosure, the term "coupled" is used, and means either a direct unbroken electrical connection between two components described as being coupled, or that is an indirect electrical connection between two components described as being coupled, such as though an intervening component.

Figure 1:
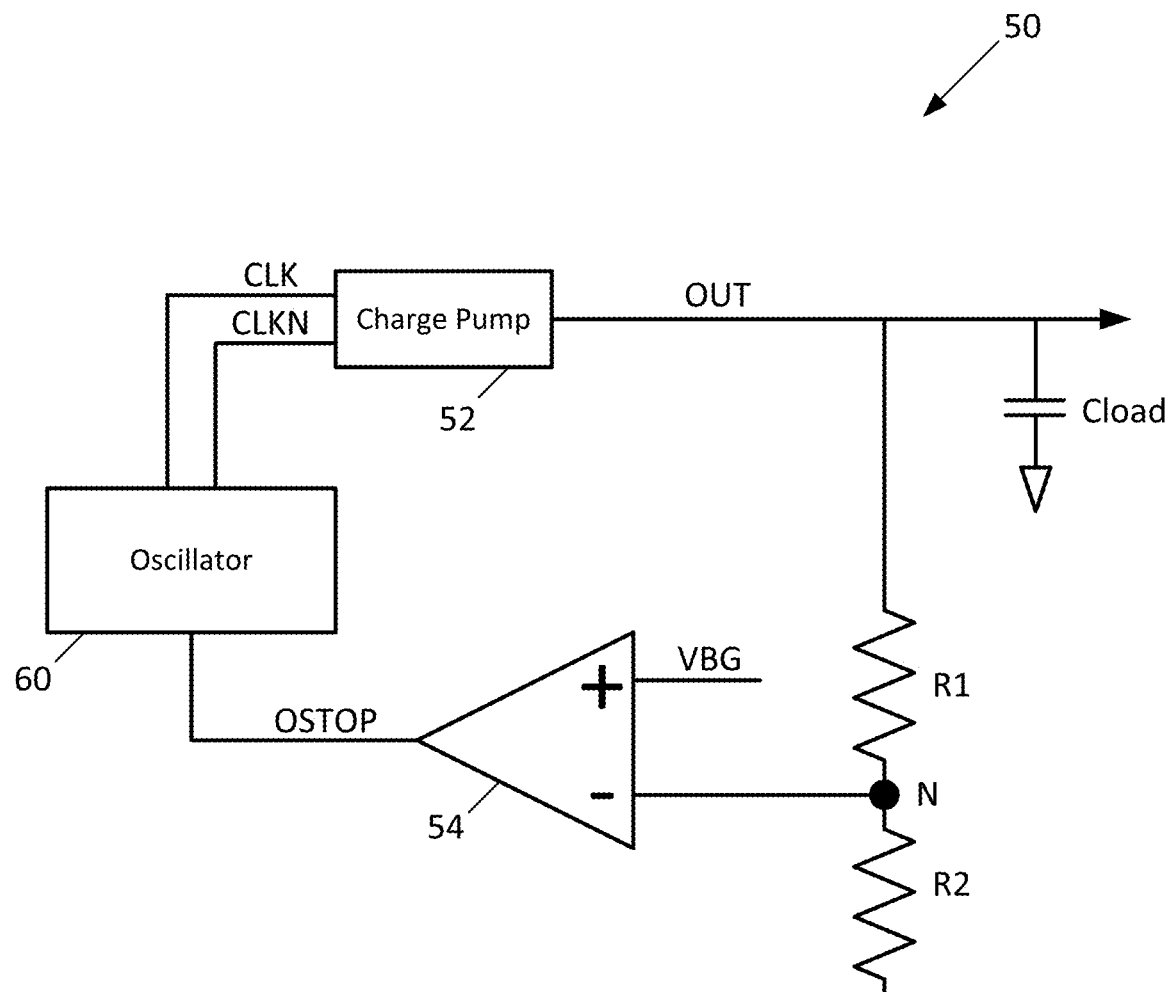
FIG. 1 is a schematic diagram of a prior art charge pump and regulation circuit for the charge pump.
Figure 2:
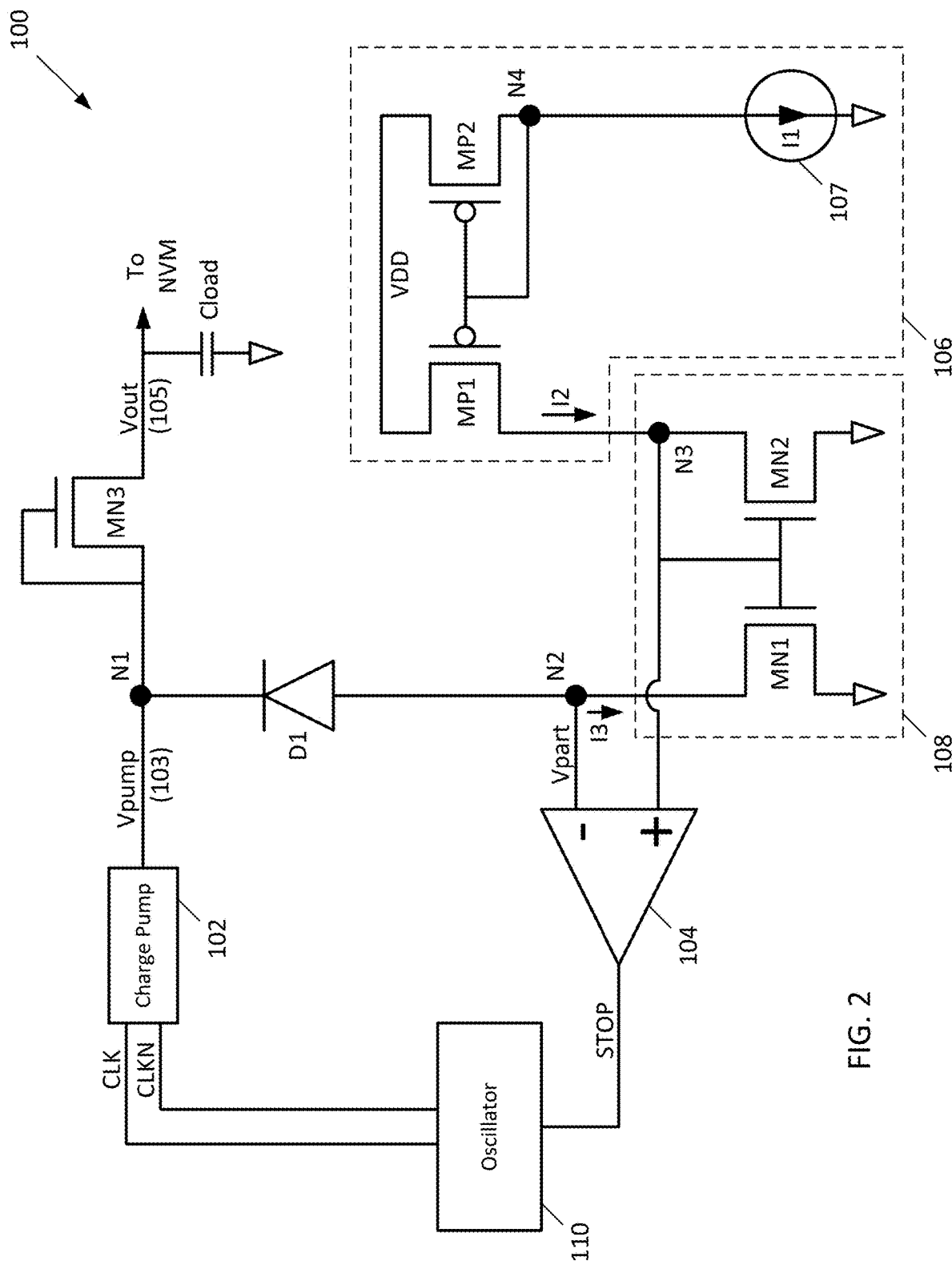
FIG. 2 is a detailed schematic diagram of a charge pump and regulation circuit for the charge pump, in accordance with this disclosure.

Now described with reference to FIG. 2 is a charge pump and regulation circuit 100. The charge pump and regulation circuit 100 includes a charge pump 102 that generates a charge pump output signal 103 at node N1. The charge pump 102 is controlled by clock signals CLK and CLKN which serve as control signals for the charge pump 102 and are logical inverts of one another. The charge pump output signal 103 has a voltage of Vpump. A diode D1 has its cathode coupled to node N1 and its anode coupled to node N2.

A comparator 104 has its inverting terminal coupled to node N2 and has its non-inverting input coupled to the output of a current sourcing circuit 106 to receive a current I2. The comparator 104 generates an oscillator control signal STOP at its output. An oscillator 110 receives the oscillator control signal STOP and generates or outputs the clock signals CLK and CLKN based upon the oscillator control signal STOP, which act as an on/off enable signal for the oscillator 110. The oscillator control signal STOP is an on/off enable signal. When STOP is at a logic high, the oscillator 110 is enabled. When STOP is at a logic low, the oscillator 110 is disabled. A current sinking circuit 108 draws a current I3 from node N2. The currents I2 and I3 are equal in magnitude, and may each have a value of 1 µA, or different value depending on the design specifications.

Figure 5:
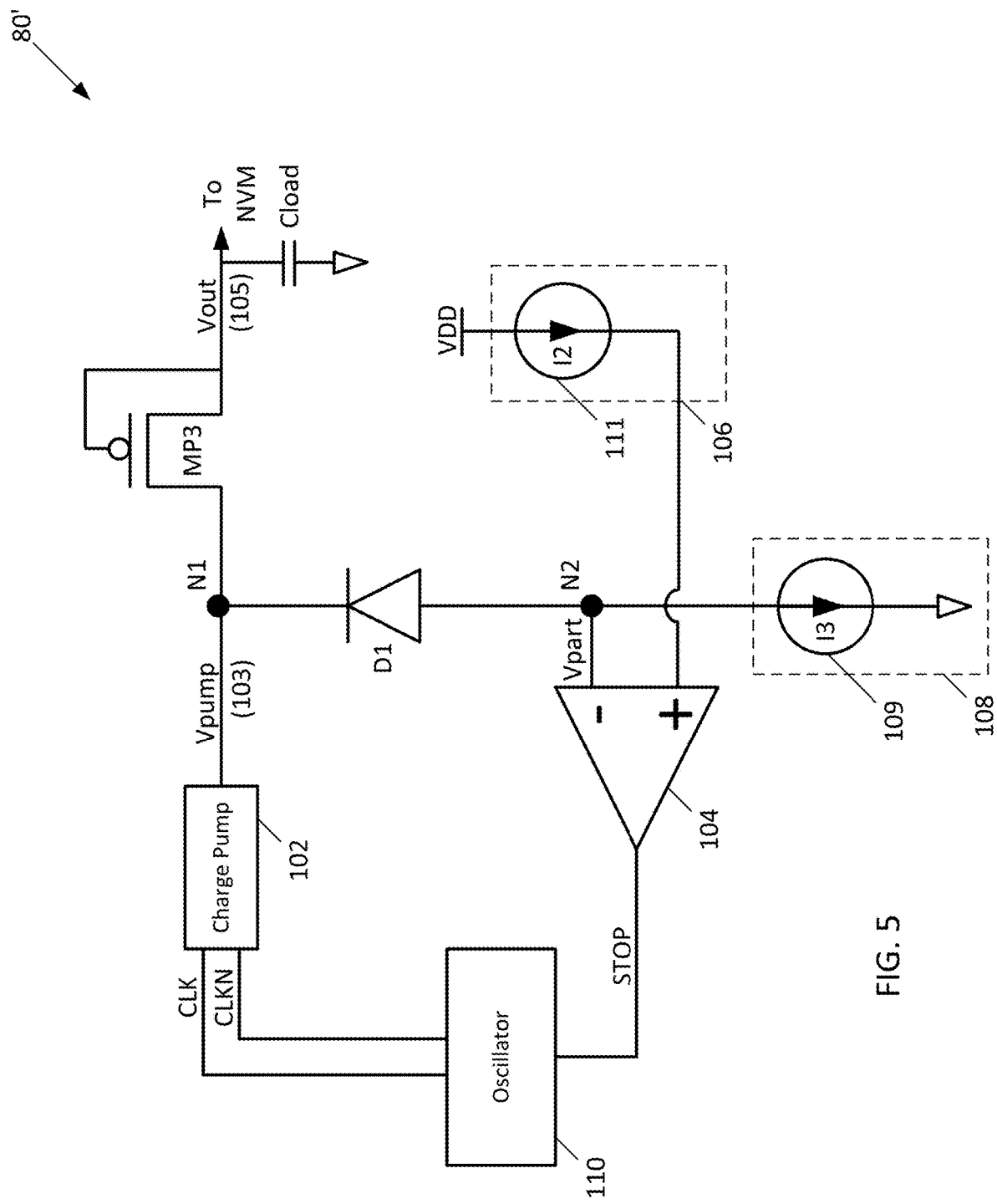
FIG. 5 is a schematic diagram of an alternative configuration of a charge pump and regulation circuit for the charge pump, in accordance with this disclosure.

A diode coupled NMOS transistor MN3 has its drain coupled to node N1, its source coupled to node Vout to produce output signal 105, and its gate coupled to its drain. The output signal 105 is provided to a non-volatile memory for use during program and erase options. A capacitor Cload represents capacitive load at node Vout. In some configurations, such as shown in FIG. 5, instead of a diode coupled NMOS transistor MN3, there is a diode coupled PMOS transistor MP3 that has its source coupled to node N1, its drain coupled to node Vout to produce output signal 105, and its gate coupled to its drain.

The current sourcing circuit 106 is comprised of a PMOS current mirror formed from PMOS transistors MP1 and MP2. PMOS transistor MP2 forms the input of the PMOS current mirror and has its source coupled to a supply node VDD, its drain coupled to a current source 107 that draws a current I1, and its gate coupled to its drain as well as to the gate of the PMOS transistor MP1. The PMOS transistor MP1 forms the output of the PMOS current mirror and has its source coupled to the supply node VDD and its drain coupled to node N3. The drain of the PMOS transistor MP1 sources current I2 to node N3, and the current I2 is equal to a multiple of the current I1, such as a multiple of 1 (meaning that current I2 may be equal to current I1). Therefore, PMOS transistor MP1 and PMOS transistor MP2 may be equal in size, or may be unequal in size, depending on the mirroring ratio of the current.

The current sinking circuit 108 is comprised of an NMOS current mirror formed from NMOS transistors MN1 and MN2. NMOS transistor MN2 forms the input of NMOS current mirror and has its drain coupled to node N3 to receive current I2, its source coupled to ground, and its gate coupled to its drain as well as to the gate of the NMOS transistor MN1 to make it a diode connected configuration. The NMOS transistor MN1 forms the output of the NMOS current mirror and has its drain coupled to the node N2 and its source coupled to ground. The drain of the NMOS transistor MN1 sinks current I3 from node N2, and current I3 is equal in magnitude to current I2. Current I3 is equal in magnitude to current I2 because the NMOS transistor MN1 is equal in size to the NMOS transistor MN2.

In operation, at startup, the voltage Vpart at node N2 is approximately at ground because little to no reverse current is flowing through the diode D1, while the current sink 108 is sinking current I3 from node N2. Since the current I2 is sourced by the current source 106 to the node N3, the voltage at the non-inverting terminal of the comparator 104 (node N3) will be greater than the voltage Vpart at node N2, which as explained, will be approximately at ground. Therefore, the oscillator control signal STOP from the comparator 104 remains at a logic high, enabling the oscillator 110, and the oscillator 110 will generate the clock signals CLK and CLKN to cause the charge pump 102 to ramp up the voltage Vpump of the charge pump output signal 103.

As Vpump begins to ramp up, the reverse current through the diode D1 begins to increase, but remains low. Until Vpump ramps up sufficiently for the reverse current through the diode D1 to be equal to the current I3 (which is known to occur for a given diode size at a voltage close to its breakdown voltage), the voltage Vpart at node N2 remains approximately at ground, maintaining the oscillator control signal STOP at a logic high, resulting ultimately in Vpump continuing to ramp up. Once Vpump ramps sufficiently for the reverse current through the diode D1 to be equal to the current I3, the voltage Vpart at the inverting terminal of the comparator 104 (node N2) will be equal to the voltage at the inverting terminal of the comparator 104 (node N3). At this point, the oscillator control signal STOP will be output by the comparator 104 at a logic low. As a result, the oscillator 110 will alter or stop the generation of the clock signals CLK and CLKN to cease ramp up of the voltage Vpump of the charge pump output signal 103 by the charge pump 104.

Since the oscillator control signal STOP will transition when the reverse current through the diode D1 is equal to the current I3, the maximum reverse current through the diode D1 is limited to the current I3 (which has the same magnitude as the current I2). Note that the reverse current through the diode D1 is a function of the actual reverse bias across the diode D1 in comparison to the actual breakdown voltage of the diode D1, meaning that the reverse current through the diode D1 increases as the current reverse bias of the diode D1 approaches the actual breakdown voltage of the diode D1. This means that by monitoring the reverse current through the diode D1, it is known whether the actual reverse bias across the diode D1 is close to the actual breakdown voltage of the diode D1.

Therefore, by monitoring the reverse current and limiting it to a level known to be safe (below the breakdown voltage of the diode D1), the reverse bias across the diode D1 is inherently limited to a safe reverse bias. This is particularly useful because, provided that the charge pump and regulation circuit 100 is formed in the same integrated circuit substrate as a non-volatile memory to which the output signal 105 is provided, and provided diode D1 is formed to match the parasitic diodes within the triple well of floating gate MOS transistors within the non-volatile memory, by maintaining the diode D1 at a reverse bias that is known to be safe, those parasitic diodes within triple well of the floating gate MOS transistors of the non-volatile memory are maintained at a safe reverse bias, preventing damage to their respective floating gate MOS transistors.

Consequently, by monitoring the reverse current through the diode D1 and setting the voltage Vpump to cease ramping when the reverse current reaches a desired maximum level known to be safe, the breakdown voltage of the diode D1 (and thus the breakdown voltage of the parasitic diodes within the triple well of the non-volatile memory) is inherently tracked as it varies due to operating conditions, since Vpump will vary as the breakdown voltage of the diode D1 varies, maintaining the reverse bias across the diode D1 (and thus the reverse bias of the parasitic diodes within the floating gate MOS transistors of the non-volatile memory) at a safe level. In terms of voltage, the reverse bias across the diode D1 will be:

$$Vrb = Vpump - Vpart$$

where Vrb is the reverse bias across the diode D1 and Vpart is the voltage at node N2, which will be equal to the drain to source voltage of NMOS transistor MN1.

The voltage Vout of the output signal 105 produced at the source of the NMOS transistor MN3 will be:

$$Vout = Vpump - Vth$$

where Vth is the threshold voltage of NMOS transistor MN3.

Figure 3A:
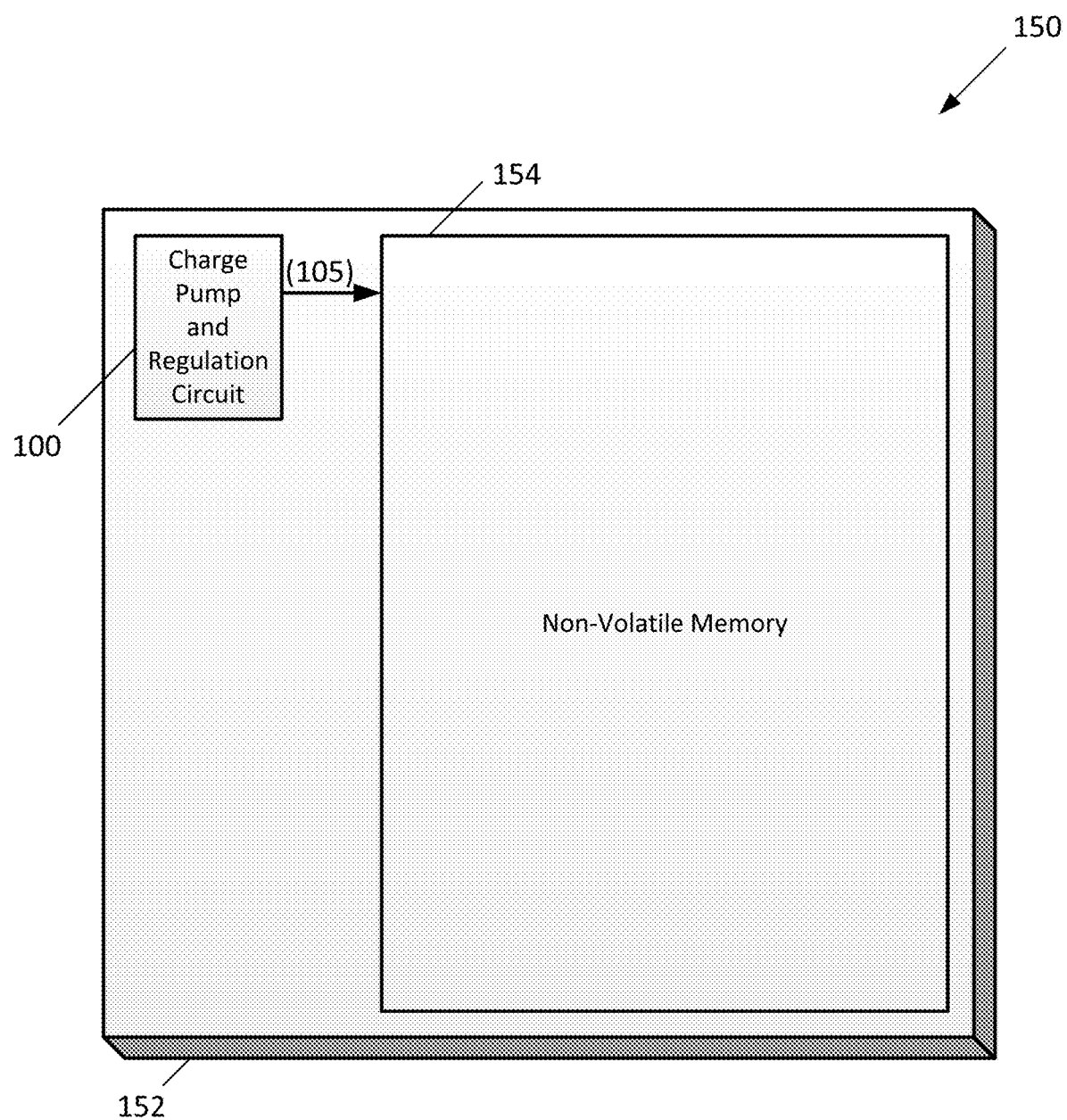
FIG. 3A is a block diagram of an integrated circuit including a non-volatile memory as well as a charge pump and regulation circuit such as that of FIG. 2 or FIG. 4.

As explained, provided that the charge pump and regulation circuit 100 is formed in the same integrated circuit substrate as a non-volatile memory to which the output signal 105 is provided, and provided diode D1 is formed to match the parasitic diodes within the floating gate MOS transistors within the non-volatile memory, by maintaining the diode D1 at a reverse bias that is known to be safe, those parasitic diodes within the floating gate MOS transistors of the non-volatile memory are maintained at a safe reverse bias, preventing damage to their respective floating gate MOS transistors. This arrangement is shown in FIG. 3A, where a memory chip 150 includes an integrated circuit substrate 152 in which the charge pump and regulation circuit 100 and a non-volatile memory 154 are formed. Note that therefore, the diode of the regulation circuit 100 and the parasitic diodes of the floating gate transistors of the non-volatile memory 154 are formed using a same process.

Figure 3B:
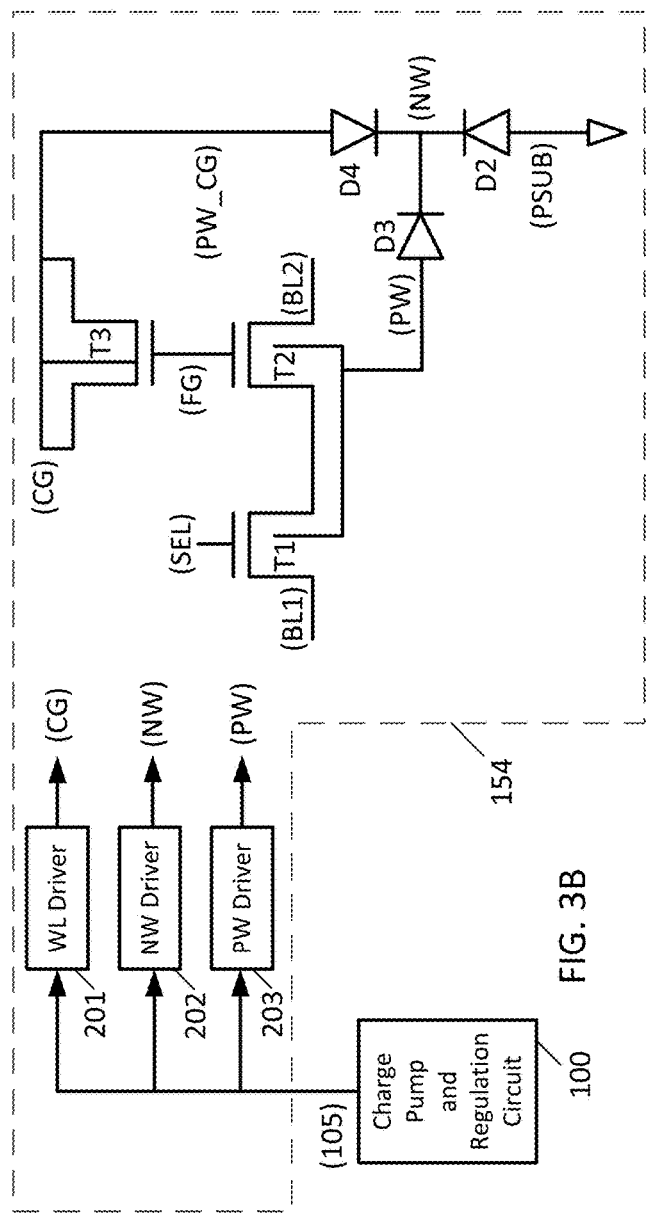
FIG. 3B is a schematic block diagram of a system comprised of a non-volatile memory and a charge pump and regulation circuit such as that of FIG. 2 or FIG. 4.

Shown in FIG. 3B is a schematic block diagram of the arrangement of the charge pump and regulation circuit 100 and non-volatile memory 154. Here, it can be seen that the charge pump and regulation circuit 100 generates the output signal 105 to a word line driver 201, n-well driver 202, and p-well driver 203. The word line driver 201 produces a control gate signal CG, the n-well driver 202 produces an n-well biasing signal NW, and the p-well driver 203 produces a p-well biasing signal PW. These signals 201, 202, and 203 are fed to memory transistors, as will be explained.

Depicted are first, second, and third triple well NMOS transistors T1, T2, and T3. The first triple well NMOS transistor T1 has its source coupled to a first bitline BL1, its drain coupled to the source of the second triple well NMOS transistor T2, its gate coupled to a selection signal SL, and its body coupled to the body of the second triple well NMOS transistor T2. The second triple well NMOS transistor T2 has its source coupled to the drain of the first triple well NMOS transistor T1 as stated, its drain coupled to a second bitline BL2, and its body coupled to the body of the first triple well NMOS transistor T1 as stated. The gate of the second triple well NMOS transistor T2 floats and is coupled to the gate of the third triple well NMOS transistor T3, which also floats. The third triple well NMOS transistor T3 has its source coupled to a control gate line CG, its gate coupled to the gate of the second triple well NMOS transistor T2 as stated, and its drain coupled to its body and its source.

Figure 3C:
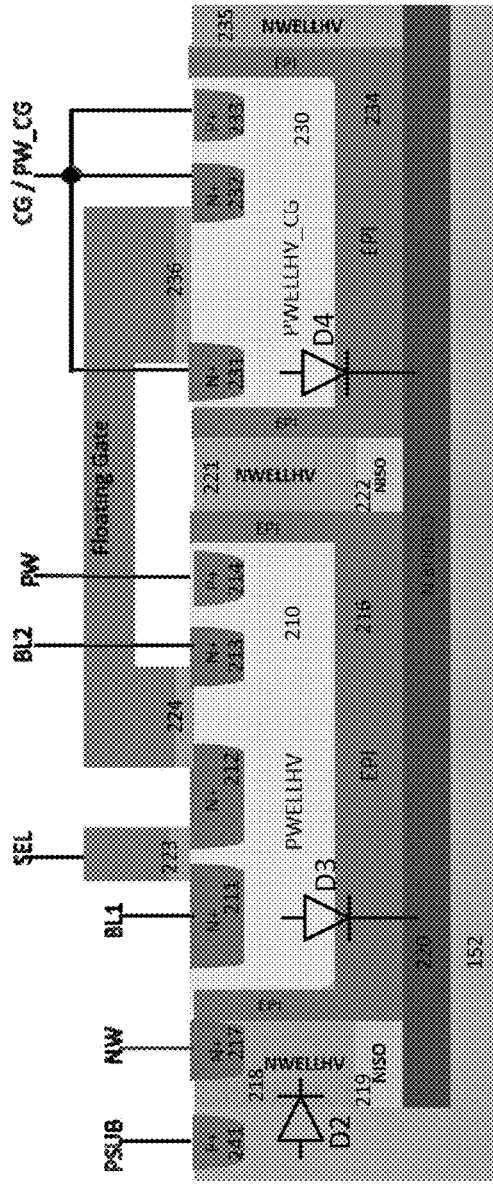
FIG. 3C is a cross sectional view of transistors of the non-volatile memory of FIG. 3B.

The specific structure of the first, second, and third triple well NMOS transistors T1, T2, and T3 are shown in FIG. 3C. The source and drain of the first triple well NMOS transistor T1 are respectively formed by N+ regions 211 and 212 formed in a p-well 210. The source and drain of the second triple well NMOS transistor T2 are respectively formed by N+ regions 212 and 213 formed in the p-well 210, therefore note that the N+ region 212 is a source/drain region as it is both drain of the first triple well NMOS transistor T1 and source of the second triple well NMOS transistor T2. The gate structure 223 of the first triple well NMOS transistor T1 is formed between the N+ regions 211 and 212, and the gate structure 224 of the second triple well NMOS transistor T2 is formed between the N+ regions 212 and 213. A P+ region 214 used to for bulk biasing is formed in the p-well 210. The p-well 210 is surrounded by an epitaxial layer 216, and a buried N layer 220 underlies the epitaxial layer 220. Bordering the epitaxial layer 216 on both sides are respectively n-well 218 and n-well 221. N-well 218 has an N+ region 217 used for biasing the buried N layer 220 formed therein, and an N type isolation layer 219 is stacked between the n-well 218 and the buried N layer 220. An N type isolation layer 222 is stacked between the n-well 221 and the buried N layer 220.

The source and drain of the third triple well NMOS transistor T3 are formed by N+ regions 231 and 232 in a p-well 230. The gate structure 236 of the third triple well NMOS transistor T3 is formed between the N+ regions 231 and 232. A P+ region 233 used for bulk biasing is formed in the p-well 230. The p-well 230 is surrounded by an epitaxial layer 234, and the buried N layer 220 underlies the epitaxial layer 234. Bordering the epitaxial layer 234 on the side opposite to the n-well 221 is an n-well 235.

Note that a substrate 152 underlies the buried N layer 220, and that a P+ layer 241 used for substrate biasing is formed in the substrate 152.

Figure 4:
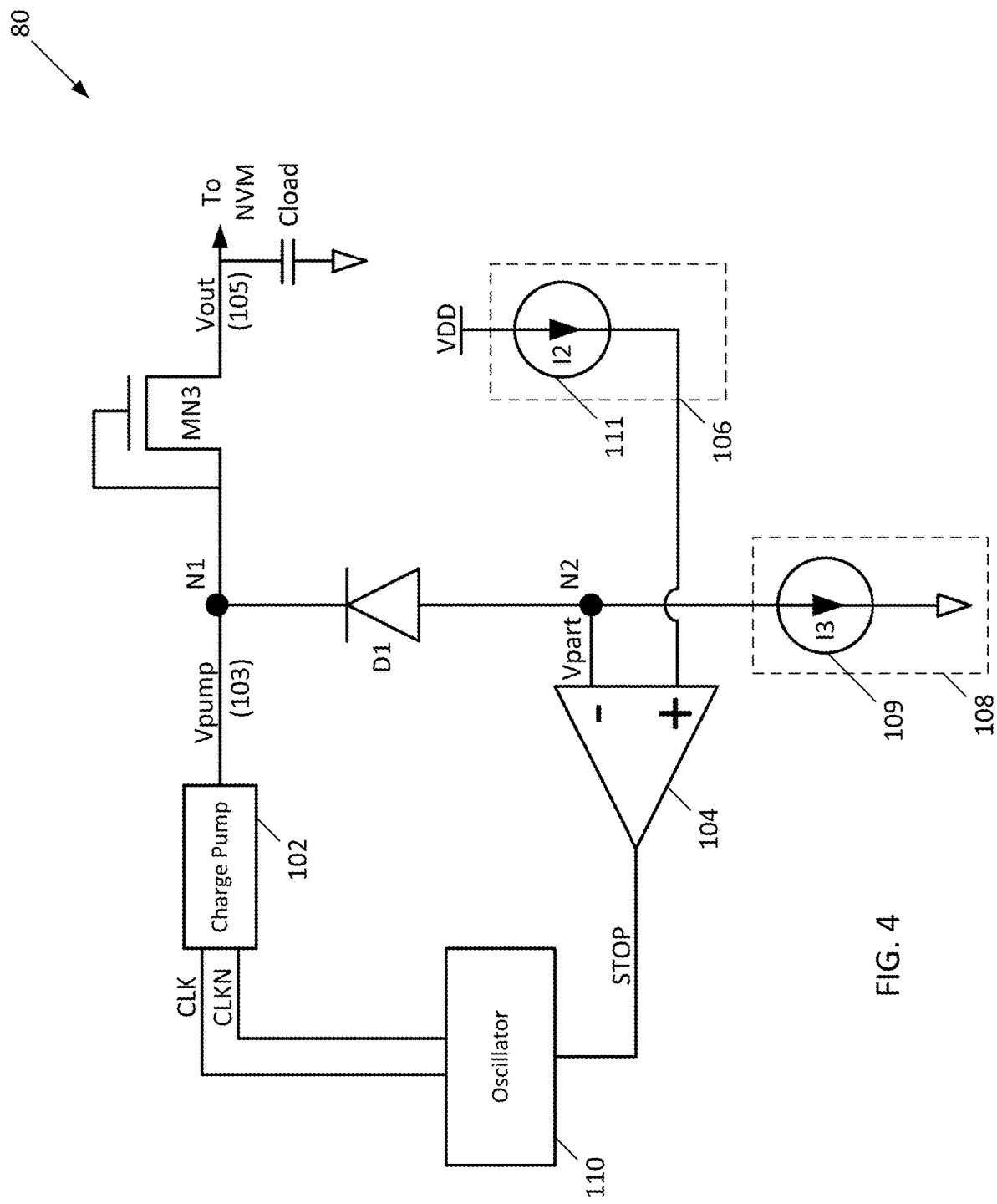
FIG. 4 is a schematic diagram of a charge pump and regulation circuit for the charge pump, in accordance with this disclosure.

As briefly explained above, parasitic diodes are inherent to the structure of MOS devices, due to the fact that a PN junction forms a PN junction diode. Therefore, due to the triple well structure of the NMOS structures T1, T2, and T3, in addition to the typical parasitic "body diodes" that would be present between the sources and drains, there are additional parasitic diodes. Parasitic diode D2 is formed between the n-well 218 and the substrate 152, while parasitic diode D3 is formed between the p-well 210 and buried N layer 220, and parasitic diode D4 is formed between the p-well 230 and the buried N layer 220. During program and erase operations, different voltage values on the control gate CG line, n-well biasing line NW, and p-well biasing line PW alter the biasing of the regions they are connected to. By tracking these parasitic diodes D2, D3, and D4 through the use of the diode D1 (see FIGS. 2 and 4 of the charge pump and regulation circuit 100), the output 105 of the charge pump and regulation circuit 100 is regulated to avoid breakdown of the parasitic diodes D2, D3, and D4.

Figure 3D:
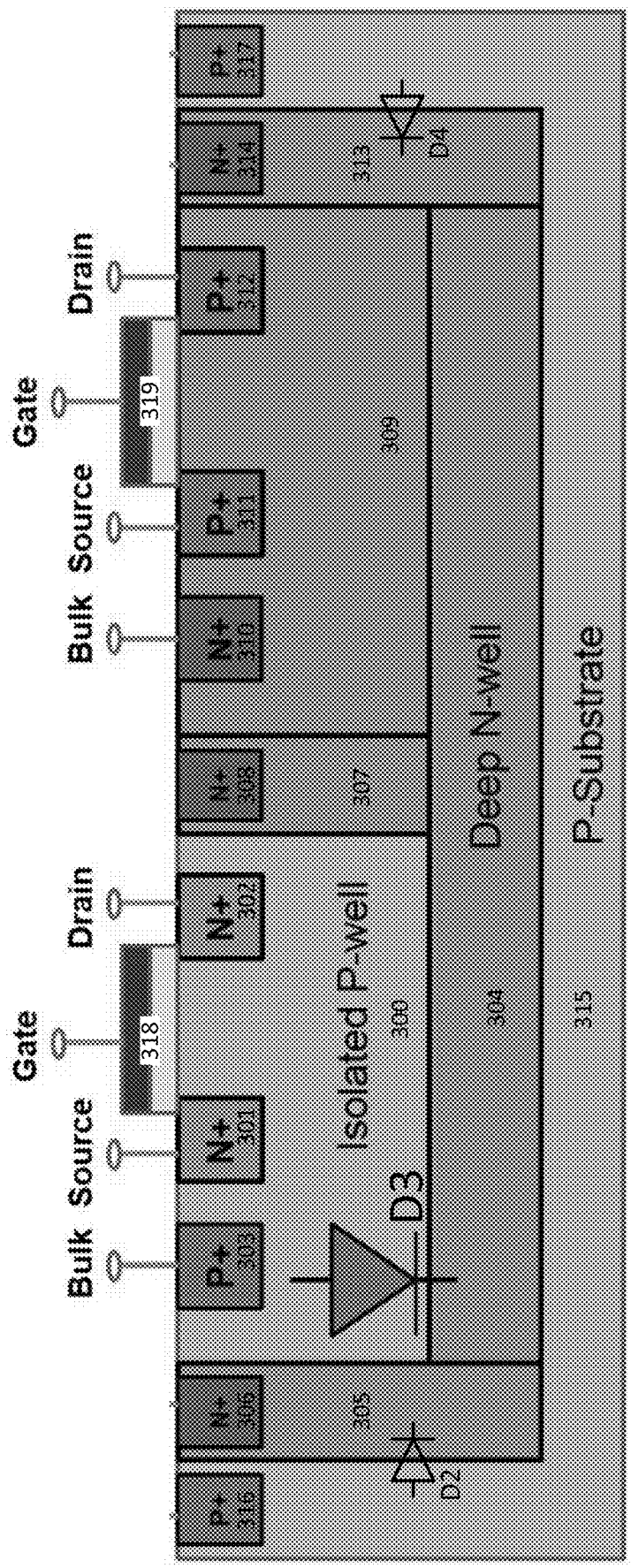
FIG. 3D is a cross sectional view of a triple well CMOS pair.

It should be appreciated that the charge pump and regulation circuit 100 may also be used to help protect parasitic diodes within triple well CMOS designs, such as that shown in FIG. 3D. Here, a triple well NMOS transistor includes N+ regions 301 and 302 formed within a p-well 300. The gate structure 318 extends between the N+ regions 301 and 302. A P+ region 303 used for bulk biasing is formed within the p-well 300. A deep n-well 304 underlies the p-well 300, and the p-well is bordered on its sides by the n-wells 305 and 307. A N+ region 306 used for biasing the deep n-well 304 is formed within the n-well 305, and likewise a N+ region 308 also usable for biasing the deep n-well 304 is formed within the n-well 307.

A triple well CMOS transistor includes P+ regions 311 and 312 formed within an n-well 309. The gate structure 319 extends between the P+ regions 311 and 312. An N+ region 310 used for bulk biasing is formed within the n-well 309. The n-well 309 is bordered by n-wells 307 and 313. The n-well 313 has an N+ region 314 formed therein also usable for biasing the deep n-well 304. A p-type substrate 315 underlies the deep n-well 304 and surrounds the n-wells 305 and 313. P+ regions 316 and 317 are formed within the p-type substrate 315 and are usable for biasing the p-type substrate.

In addition to the typical parasitic body diodes between source and drain, a parasitic diode D2 is formed between n-well 305 and the substrate 315, while a parasitic diode D3 is formed between the p-well 300 and the deep n-well 304, and a parasitic diode D4 is formed between the n-well 313 and the substrate 315.

By tracking these parasitic diodes D2, D3, and D4 through the use of the diode D1 (see FIGS. 2 and 4 of the charge pump and regulation circuit 100), the output 105 of the charge pump and regulation circuit 100 is regulated to avoid breakdown of the parasitic diodes D2, D3, and D4 due to different biases that may be generated based upon the output 105 and used to bias the p-well 300, substrate 315, and n-wells 305 and 313.

Owing to this regulation scheme, the voltage Vpump of the charge pump output 103 can be maintained at a level where the diode D1 is close to, but not at, its breakdown voltage. This provides for high efficiency in program and erase operations of the non-volatile memory 154 without fear of breakdown of the parasitic diodes within the triple well used for the non-volatile memory 154, because Vpump and therefore Vout can be maintained at a maximum safe level as operating conditions vary.

While this design eliminates the resistive ladder of prior art designs, it adds components not present in those designs. There is therefore a net area gain of about 15%, however in addition there is a reduced cost of forming these designs, as high voltage rails are not necessary. Note that the area gain can vary with specific designs, applications, and specifications. In addition, this design permits any density of memory designs without impacting the efficiency of program and erase operations. Also, due to the lack of a resistive ladder, the current load on the charge pump 102 is decreased, reducing power consumption by about 20%. This percentage may vary with specific designs, applications, and specifications, so power consumption reduction may be different in some instances.

It should be appreciated that the current sinking circuit 108 and current sourcing circuit 106 need not be comprised of current mirrors as shown in FIG. 2. Instead, as shown in the charge pump and regulation circuit 100 of FIG. 4, the current sinking circuit 108 may utilize any current source 109 that draws the current I3, and the current sourcing circuit 106 may utilize any current source 111 that provides the current I2, provided that the currents I3 and I2 are equal in magnitude.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
a charge pump circuit configured to generate a charge pump output signal at a first node, the charge pump circuit being enabled as a function of at least one charge pump control signal;
a diode having a first terminal coupled to the first node and a second terminal coupled to a second node, said diode supplying a reverse current to the second node;
a comparator having a first input coupled to the second node and a second input coupled to a third node, the comparator configured to generate the at least one charge pump control signal; and
a current mirror configured to draw a first current from the second node and apply a second current to the third node.

2. The circuit of claim 1, wherein the first terminal of the diode is a cathode; wherein the second terminal of the diode is an anode.

3. The circuit of claim 1, wherein the first current and second current have a same magnitude.

4. The circuit of claim 1, wherein the comparator generates an oscillator control signal; and further comprising an oscillator configured to generate the at least one charge pump control signal as a function of the oscillator control signal generated by the comparator.

5. The circuit of claim 1, wherein the circuit further comprises a non-volatile memory; and wherein the diode is formed using a same process as transistors of the non-volatile memory.

6. The circuit of claim 1, wherein the circuit comprises a semiconductor substrate; further comprising a non-volatile memory formed in the semiconductor substrate; and wherein the diode is also formed in the semiconductor substrate.

7. The circuit of claim 1, wherein the current mirror comprises:
a first transistor having a drain coupled to the second node, a source coupled to a reference voltage, and a gate; and
a second transistor having a drain coupled to the third node, a source coupled to the reference voltage, and a gate coupled to the gate of the first transistor and to the drain of the second transistor.

8. The circuit of claim 1, further comprising a diode coupled transistor having a drain coupled to the first node, a source providing an output signal, and a gate coupled to the drain of the diode coupled transistor.

9. The circuit of claim 1, wherein the at least one charge pump control signal comprises a clock signal and a complement of the clock signal.

10. A circuit, comprising:
a charge pump circuit configured to generate a charge pump output signal at a first node, the charge pump circuit being enabled as a function of at least one charge pump control signal;
a diode having a first terminal directly electrically connected to the first node and a second terminal directly electrically connected to a second node, said diode supplying a reverse current to the second node;
a comparator having a first input coupled to the second node and a second input coupled to a third node, the comparator configured to cause generation of the at least one charge pump control signal;
a first current source configured to draw a first current from the second node; and
a second current source configured to apply a second current to the third node.

11. The circuit of claim 10, wherein the first terminal of the diode is a cathode; wherein the second terminal of the diode is an anode.

12. The circuit of claim 10, wherein the comparator generates an oscillator control signal; and further comprising an oscillator configured to generate the at least one charge pump control signal as a function of the oscillator control signal generated by the comparator.

13. The circuit of claim 10, wherein the circuit further comprises a non-volatile memory; and wherein the diode is formed using a same process as transistors of the non-volatile memory.

14. The circuit of claim 10, wherein the circuit comprises a semiconductor substrate; further comprising a non-volatile memory formed in the semiconductor substrate; and wherein the diode is also formed in the semiconductor substrate.

15. The circuit of claim 10, further comprising a diode coupled transistor having a drain coupled to the first node, a source providing an output signal, and a gate coupled to the drain of the diode coupled transistor.

16. The circuit of claim 10, wherein the at least one charge pump control signal comprises a clock signal and a complement of the clock signal.

17. The circuit of claim 10, wherein the first input of the comparator is directly electrically connected to the second node, and wherein the second input of the comparator is directly electrically connected to the third node.

18. A circuit, comprising: of claim 10, a charge pump circuit configured to generate a charge pump output signal at a first node, the charge pump circuit being enabled as a function of at least one charge pump control signal;
a diode having a first terminal coupled to the first node and a second terminal coupled to a second node, said diode supplying a reverse current to the second node;
a comparator having a first input coupled to the second node and a second input coupled to a third node, the comparator configured to cause generation of the at least one charge pump control signal;
a first current source configured to draw a first current from the second node; and
a second current source configured to apply a second current to the third node;
wherein the first current and second current have a same magnitude.

19. The circuit of claim 18, further comprising a diode coupled transistor having a drain coupled to the first node, a source providing an output signal, and a gate coupled to the drain of the diode coupled transistor.

20. The circuit of claim 18, wherein the at least one charge pump control signal comprises a clock signal and a complement of the clock signal.

21. The circuit of claim 18, wherein the comparator generates an oscillator control signal; and further comprising an oscillator configured to generate the at least one charge pump control signal as a function of the oscillator control signal generated by the comparator.

22. The circuit of claim 18, wherein the circuit further comprises a non-volatile memory; and wherein the diode is formed using a same process as transistors of the non-volatile memory.

23. The circuit of claim 18, wherein the circuit comprises a semiconductor substrate; further comprising a non-volatile memory formed in the semiconductor substrate; and wherein the diode is also formed in the semiconductor substrate.

24. A circuit, comprising:
a charge pump circuit configured to generate a charge pump output signal at a first node, the charge pump circuit being enabled as a function of at least one charge pump control signal;
a diode having a first terminal coupled to the first node and a second terminal coupled to a second node, said diode supplying a reverse current to the second node;
a comparator having a first input coupled to the second node and a second input coupled to a third node, the comparator configured to cause generation of the at least one charge pump control signal;
a first current source configured to draw a first current from the second node; and
a second current source configured to apply a second current to the third node;
wherein the first and second current sources are arranged in a current mirror configuration.

25. The circuit of claim 24, further comprising a diode coupled transistor having a drain coupled to the first node, a source providing an output signal, and a gate coupled to the drain of the diode coupled transistor.

26. The circuit of claim 24, wherein the at least one charge pump control signal comprises a clock signal and a complement of the clock signal.

27. The circuit of claim 24, wherein the comparator generates an oscillator control signal; and further comprising an oscillator configured to generate the at least one charge pump control signal as a function of the oscillator control signal generated by the comparator.

28. The circuit of claim 24, wherein the circuit further comprises a non-volatile memory; and wherein the diode is formed using a same process as transistors of the non-volatile memory.

29. The circuit of claim 24, wherein the circuit comprises a semiconductor substrate; further comprising a non-volatile memory formed in the semiconductor substrate; and wherein the diode is also formed in the semiconductor substrate.

30. A circuit, comprising:
a charge pump circuit generating a charge pump output signal at a first node as a function of at least one charge pump control signal;
a diode having a first terminal coupled to the first node and a second terminal coupled to a second node;
a first current mirror configured to produce a first current at the second node;
a second current mirror configured to produce a second current at a third node, the second current having a same magnitude as the first current; and
a comparison circuit configured to:
compare a voltage at the second node to a voltage at the third node;
cause the at least one charge pump control signal to direct the charge pump circuit to generate the charge pump output signal having a voltage that ramps in magnitude, based upon the voltage at the second node being unequal to the voltage at the third node; and
cause the at least one charge pump control signal to direct the charge pump circuit to cease the ramping of the voltage of the charge pump output signal, if the voltage at the second node is at least equal to the voltage at the third node.

31. The circuit of claim 30, wherein the comparison circuit is configured to:
cause the at least one charge pump control signal to direct the charge pump circuit to generate the charge pump output signal having a voltage that ramps upward in magnitude, if the voltage at the second node is less than the voltage at the third node; and
cause the at least one charge pump control signal to direct the charge pump circuit to cease upward ramp of the voltage of the charge pump output signal, if the voltage at the second node is at least equal to the voltage at the third node.

32. The circuit of claim 30, wherein the first current mirror comprises a current sink configured to sink a first current from the second node; wherein the second current mirror comprises a current source configured to source a second current to the third node.

33. The circuit of claim 32, wherein the current sink comprises a first current mirror having an input coupled to the third node and an output coupled to the second node.

34. The circuit of claim 32, wherein the current source comprises a second current mirror having an input coupled to a current source and an output coupled to the third node.

35. The circuit of claim 30, wherein the circuit further comprises a non-volatile memory; and wherein the diode is formed using a same process as transistors of the non-volatile memory.

36. The circuit of claim 30, wherein the circuit comprises a semiconductor substrate; further comprising a non-volatile memory formed in the semiconductor substrate; and wherein the diode is also formed in the semiconductor substrate.

37. A method, comprising:
generating a charge pump output signal that has a voltage that ramps;
receiving the charge pump output signal at a first terminal of a diode;
producing a first current at a second terminal of the diode;
producing a second current to a node, the second current being equal in magnitude to the first current;
comparing a voltage at the node to a voltage at the second terminal of the diode; and when the voltage at the second terminal of the diode becomes equal to the voltage at the node, causing the charge pump output signal to cease ramping.

38. The method of claim 37, wherein the charge pump output signal has a voltage that ramps upward in magnitude; wherein the first terminal of the diode is a cathode of the diode; wherein the first current is a first current sunk from an anode of the diode; wherein the second current is a second current sourced to the node; wherein, when the voltage at the anode of the diode becomes equal to the voltage at the node, charge pump output signal is caused to cease ramping upward in magnitude.

39. The method of claim 38, wherein sinking the first current from the anode of the diode is performed by mirroring the second current to be drawn from the anode of the diode as the first current.

40. The method of claim 37, wherein providing the second current to the node is performed by mirroring a reference current to the node as the second current.

41. The method of claim 37, wherein producing the first current to the second terminal of the diode is performed by mirroring the second current as the first current.

42. A method, comprising:
   pumping a charge pump to output a voltage;
   receiving the voltage output by the charge pump at a first terminal of a diode;
   producing a first current at a second terminal of the diode;
   producing a second current to a node, the second current being equal in magnitude to the first current;
   comparing a voltage at the node to a voltage at the second terminal of the diode; and
   when the voltage at the second terminal of the diode becomes equal to the voltage at the node, stop pumping of the charge pump.

43. The method of claim 42, wherein the first terminal of the diode is a cathode; wherein the second terminal of the diode is an anode; wherein the first current is sunk from the anode of the diode; and wherein the second current is sourced to the node.

44. The method of claim 43, wherein sourcing the second current to the node is performed by mirroring a reference current to the node as the second current.

45. The method of claim 43, wherein sinking the first current from the anode of the diode is performed by mirroring the second current to be drawn from the anode of the diode as the first current.

46. The method of claim 42, wherein producing the second current at the node is performed by mirroring a reference current to the node as the second current.

47. The method of claim 42, wherein producing the first current to second terminal of the diode is performed by mirroring the second current as the first current.

* * * * *